United States Patent
Ryu et al.

(10) Patent No.: US 10,755,018 B2
(45) Date of Patent: Aug. 25, 2020

(54) SEMICONDUCTOR DEVICE

(71) Applicant: Samsung Electronics Co., Ltd., Suwon-si, Gyeonggi-do (KR)

(72) Inventors: Jong Kyu Ryu, Seoul (KR); Minsu Kim, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 88 days.

(21) Appl. No.: 16/102,888

(22) Filed: Aug. 14, 2018

(65) Prior Publication Data
US 2019/0220568 A1 Jul. 18, 2019

(30) Foreign Application Priority Data
Jan. 15, 2018 (KR) .................. 10-2018-0005054

(51) Int. Cl.
G06F 17/50 (2006.01)
G06F 30/392 (2020.01)
H01L 29/66 (2006.01)
H01L 27/02 (2006.01)
H01L 27/118 (2006.01)

(52) U.S. Cl.
CPC ........ G06F 30/392 (2020.01); H01L 27/0207 (2013.01); H01L 27/11807 (2013.01); H01L 29/66545 (2013.01); *H01L 2027/11874* (2013.01)

(58) Field of Classification Search
CPC ............. G06F 30/392; H01L 27/11807; H01L 27/0207; H01L 29/66545; H01L 2027/11874; H01L 21/823431; H01L 27/0886

USPC ........................................................ 716/119
See application file for complete search history.

(56) References Cited

U.S. PATENT DOCUMENTS

| | | | |
|---|---|---|---|
| 8,173,491 B2 | 5/2012 | Law et al. | |
| 8,836,040 B2 | 9/2014 | Kamal et al. | |
| 8,959,472 B1 | 2/2015 | Frederick, Jr. et al. | |
| 9,514,260 B2 | 12/2016 | Kim | |
| 9,653,413 B2 | 5/2017 | Frederick, Jr. et al. | |
| 9,659,130 B2 | 5/2017 | Kim et al. | |
| 2016/0117431 A1* | 4/2016 | Kim | G06F 17/5072 716/119 |
| 2016/0190130 A1* | 6/2016 | Yu | H01L 21/823481 257/401 |

* cited by examiner

*Primary Examiner* — Jack Chiang
*Assistant Examiner* — Brandon Bowers
(74) *Attorney, Agent, or Firm* — Harness, Dickey & Pierce, P.L.C.

(57) ABSTRACT

A semiconductor device includes a first standard cell and a second standard cell. A single diffusion break region extending in a first direction is formed in the first standard cell, and a first edge region extending in the first direction and having a maximum cutting depth in a depth direction perpendicular to the first direction is in the first standard cell. A double diffusion break region extending in the first direction is formed in the second standard cell, and a second edge region extending in the first direction and having the maximum cutting depth in the depth direction is formed in the second standard cell.

19 Claims, 12 Drawing Sheets

SEMICONDUCTOR DEVICE

CROSS-REFERENCE TO RELATED APPLICATIONS

This application claims priority under 35 U.S.C. § 119 to Korean Patent Application No. 10-2018-0005054 filed on Jan. 15, 2018, in the Korean Intellectual Property Office, the disclosures of which are incorporated by reference herein in their entireties.

BACKGROUND

Embodiments of the inventive concepts described herein relate to a semiconductor device, and more particularly, relate to a semiconductor device including a standard cell in which a single diffusion break region is formed and a standard cell in which a double diffusion break region is formed.

A semiconductor device may include an integrated circuit for performing various functions. A structure, a process, and/or a property of matter of the semiconductor device is being developed to overcome various issues occurring as the size of the semiconductor device gradually decreases.

The semiconductor device may include a plurality of standard cells. A standard cell may be a block provided for implementation of various functions. The standard cell may make the design of an integrated circuit easy. The semiconductor device is implemented by combining various standard cells to perform a specific function.

SUMMARY

Embodiments of the inventive concepts provide secure integration, stability, and/or reliability of the semiconductor device by combining standard cells.

Embodiments of the inventive concepts provide a semiconductor device that secures reliability and stability while reducing the area needed to implement the semiconductor device.

According to an example embodiment, a semiconductor device includes a first standard cell and a second standard cell. A single diffusion break region extending in a first direction is formed in the first standard cell, and a first edge region extending in the first direction and having a maximum cutting depth in a depth direction perpendicular to the first direction is in the first standard cell. A double diffusion break region extending in the first direction is formed in the second standard cell, and a second edge region extending in the first direction and having the maximum cutting depth in the depth direction is formed in the second standard cell. The first standard cell is in contact with the second standard cell in a second direction intersecting the first direction.

Alternatively, in the first standard cell, a first diffusion break region having a first depth is formed on a substrate, and a first edge region having the first depth is formed on the substrate. In the second standard cell, a second diffusion break region having a second depth different from the first depth is formed on the substrate, and a second edge region having the first depth is formed on the substrate. The first edge region and the second edge region of the substrate are adjacent to each other.

Alternatively, a single diffusion break region that extends in the first direction and has a first width the second direction intersecting the first direction is formed in the first standard cell, and a first edge region that extends in the first direction and includes a first contact pattern is formed in the first standard cell. A double diffusion break region that extends in the first direction and has a second width wider than the first width in the second direction is formed in the second standard cell, and a second edge region that extends in the first direction and includes a second contact pattern electrically connected with the first contact pattern is formed in the second standard cell. Each of the first contact pattern and the second contact pattern has a third width narrower than the first width in the second direction.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, embodiments of the inventive concepts will be described clearly and in detail with reference to accompanying drawings to such an extent that an ordinary one in the art implements embodiments of the invention.

Below, first to third directions DR1 to DR3 are defined to describe a semiconductor device according to an embodiment of the inventive concepts. For convenience of description, the first to third directions DR1 to DR3 are defined as being orthogonal to each other. A semiconductor device may include various standard cells, and the standard cells may be arranged adjacent to each other. Each of the standard cells may include a diffusion break region for the purpose of insulating an implemented element region. The first direction DR1 is defined as a direction in which the diffusion break region extends. The second direction DR2 is defined as a longitudinal direction of the diffusion break region. Various standard cells may be arranged adjacent to each other in the second direction DR2. The third direction DR3 is defined as a thickness direction of the standard cells when viewed from above.

Below, a description will be given under the condition that a standard cell includes an edge region. Here, the edge region may be understood as a boundary region of a standard cell.

Figure 1:
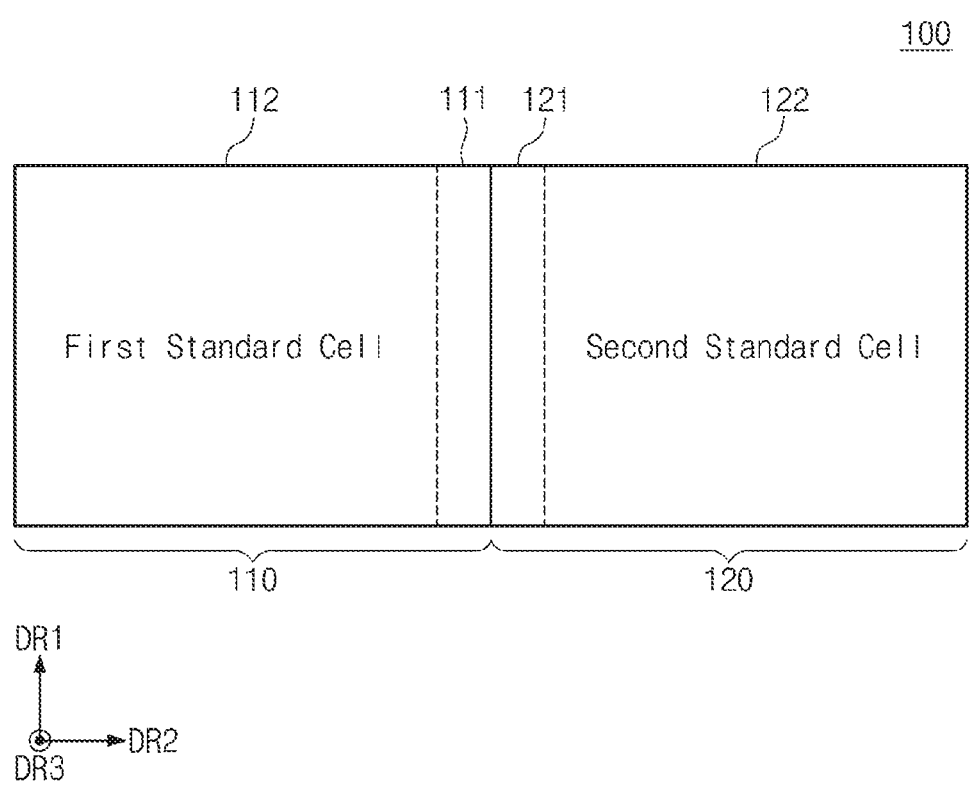
FIG. 1 is a view for describing a semiconductor device according to an embodiment of the inventive concepts.

FIG. 1 is a view for describing a semiconductor device according to an embodiment of the inventive concepts. Referring to FIG. 1, a semiconductor device 100 includes a first standard cell 110 and a second standard cell 120. The first and second standard cells 110 and 120 may have different diffusion break regions. An element that performs a specific function may be implemented in each of the first standard cell 110 and the second standard cell region 120. The first standard cell 110 may include a first edge region 111 and a first element region 112. The first edge region 111 may extend in the first direction DR1. The first edge region 111 may be in contact with the second standard cell 120 adjacent in the second direction DR2. The first edge region 111 may include a diffusion break region that electrically insulates the first element region 112 from the second standard cell 120. To this end, the first edge region 111 may be cut to form a trench in the third direction DR3. The cut region may be filled with an isolation layer. The isolation layer may be formed by a shallow trench isolation (STI) process.

Alternatively, the first edge region 111 may include a signal contact pattern or a power contact pattern. In this case, the first standard cell 110 may receive an operation signal for driving the first element region 112 by using the signal contact pattern. Alternatively, the first standard cell 110 may be supplied with a power supply voltage for driving the first element region 112 through the power contact pattern.

An element that performs a unique function of the first standard cell 110 may be implemented in the first element region 112. To this end, the first standard cell 110 may include a gate pattern, a contact pattern, and/or a fin disposed on a substrate. The gate pattern may extend in the first direction DR1, and the fin may extend in the second direction DR2. A part of the gate pattern or the fin may be cut to implement an element that performs a unique function of the first standard cell 110. A region where a part of the gate pattern or the fin is cut may be defined as a diffusion break region. The diffusion break region may be a single diffusion break region in which a trench is formed by using one gate pattern.

The second standard cell 120 may include a second edge region 121 and a second element region 122. The second edge region 121 may extend in the first direction DR1. The second edge region 121 may be in contact with the first edge region 111 adjacent in the second direction DR2. The second edge region 121 may include a diffusion break region that electrically insulates the second element region 122 from the first standard cell 110. To this end, the second edge region 121 may be cut to form a trench in the third direction DR3. The cut region may be filled with an isolation layer. The isolation layer may be the shallow trench isolation (STI).

The trench formed in the second edge region 121 may be formed in the same manner as the trench formed in the first edge region 111. Both the trench of the first edge region 111 and the trench of the second edge region 121 may be formed based on single diffusion break. Alternatively, both the trench of the first edge region 111 and the trench of the second edge region 121 may be formed based on double diffusion break. That is, the maximum cutting depth of the first edge region 111 may be the same as the maximum cutting depth of the second edge region 121. Alternatively, in the case where the first edge region 111 includes the signal contact pattern, the second edge region 121 may include the signal contact pattern. Alternatively, in the case where the first edge region 111 includes the power contact pattern, the second edge region 121 may include the power contact pattern.

An element that performs a unique function of the second standard cell 120 may be implemented in the second element region 122. An element that performs a function different from a function of the first element region may be implemented in the second element region 122. However, the inventive concepts are not limited thereto. The second standard cell 120 may include a gate pattern, a contact pattern, and/or a fin disposed on the substrate, and a part of the gate pattern or the fin may be cut. A region where a part of the gate pattern or the fin is cut may be defined as a diffusion break region. The diffusion break region of the second element region 122 may be a double diffusion break region in which a cut region is formed by using two gate patterns. That is, the diffusion break region of the first element region 112 and the diffusion break region of the second element region 122 may be formed in different manners, which will be described later.

Figure 2:
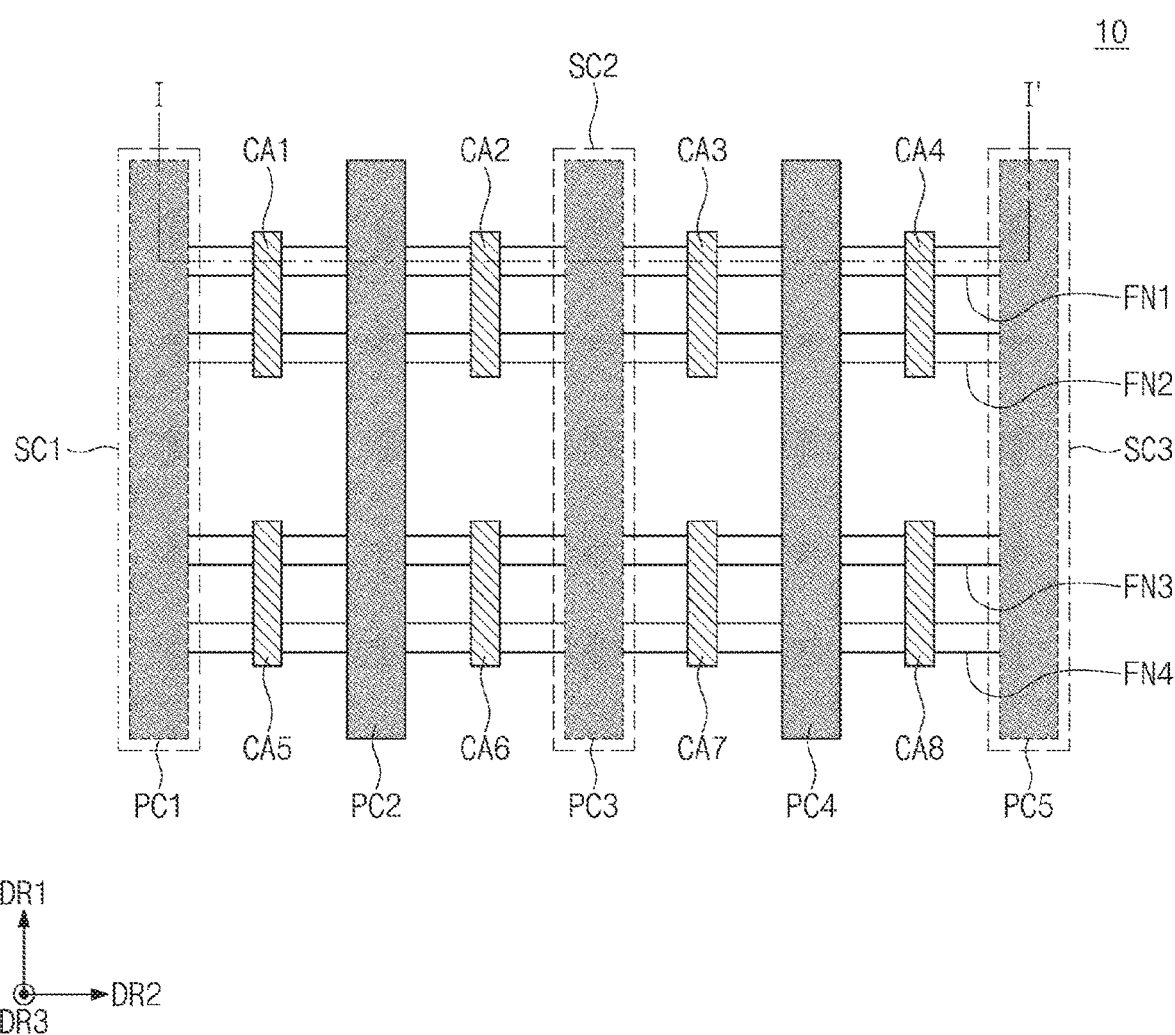
FIG. 2 is a view for describing a standard cell in which a single diffusion break region is formed.

FIG. 2 is a view for describing a standard cell in which a single diffusion break region is formed. That is, FIG. 2 is a view for describing the first element region 112 in the first standard cell 110 of FIG. 1. Referring to FIG. 2, a standard cell 10 may include first to fifth gate patterns PC1 to PC5, first to fourth fins FN1 to FN4, and first to eighth contact patterns CA1 to CA8. It may be understood that the number of gate patterns, the number of fins, the number of contact patterns, the arrangement of patterns, and a connection relationship of patterns are determined for convenience of description. That is, the standard cell 10 may include gate patterns, fins, and contact patterns, which may be variously changed or modified in number and with regard to arrangement and connection relationship.

The first to fifth gate patterns PC1 to PC5 extend in the first direction DR1. The first to fifth gate patterns PC1 to PC5 may be disposed in parallel and may be spaced apart from each other in the second direction DR2. The first gate pattern PC1, the third gate pattern PC3, and the fifth gate pattern PC5 may form a first single diffusion break region SC1, a second single diffusion break region SC2, and a third single diffusion break region SC3. That is, the first gate pattern PC1, the third gate pattern PC3, and the fifth gate pattern PC5 may be dummy gate patterns. A trench may be formed in each of the first to third single diffusion break regions SC1 to SC3 and may be filled with an isolation layer. Each of the second gate pattern PC2 and the fourth gate pattern PC4 may be used as a gate terminal of a transistor element.

The first to fourth fins FN1 to FN4 extend in the second direction DR2. The first to fourth fins FN1 to FN4 may be disposed in parallel and may be spaced apart from each other in the first direction DR1. The first fin FN1 and the second fin FN2 may be electrically connected with the first to fourth contact patterns CA1 to CA4. The third fin FN3 and the fourth fin FN4 may be electrically connected with the fifth to eighth contact patterns CA5 to CA8. The first to fourth fins FN1 to FN4 may be insulated or isolated by the first to third single diffusion break regions SC1 to SC3. Depending on a voltage applied to the second gate pattern PC2 or the fourth gate pattern PC4, the first to fourth fins FN1 to FN4 may be provided with a signal from the first to eighth contact patterns CA1 to CA8 or may provide a signal to the first to eighth contact patterns CA1 to CA8.

The first to eighth contact patterns CA1 to CA8 extend in the first direction DR1. The first to eighth contact patterns CA1 to CA8 may be disposed in parallel and may be spaced apart from each other in the second direction DR2. Each of the first to eighth contact patterns CA1 to CA8 is illustrated as being electrically connected with two fins, but the inventive concepts are not limited thereto. Each of the first to eighth contact patterns CA1 to CA8 may be used as a source terminal or a drain terminal of a transistor element.

The second contact pattern CA2 and the third contact pattern CA3 may be electrically insulated by the second single diffusion break region SC2. The sixth contact pattern CA6 and the seventh contact pattern CA7 may be electrically insulated by the second single diffusion break region SC2. A region that is electrically insulated by using a single diffusion break region may be determined.

Figure 3:
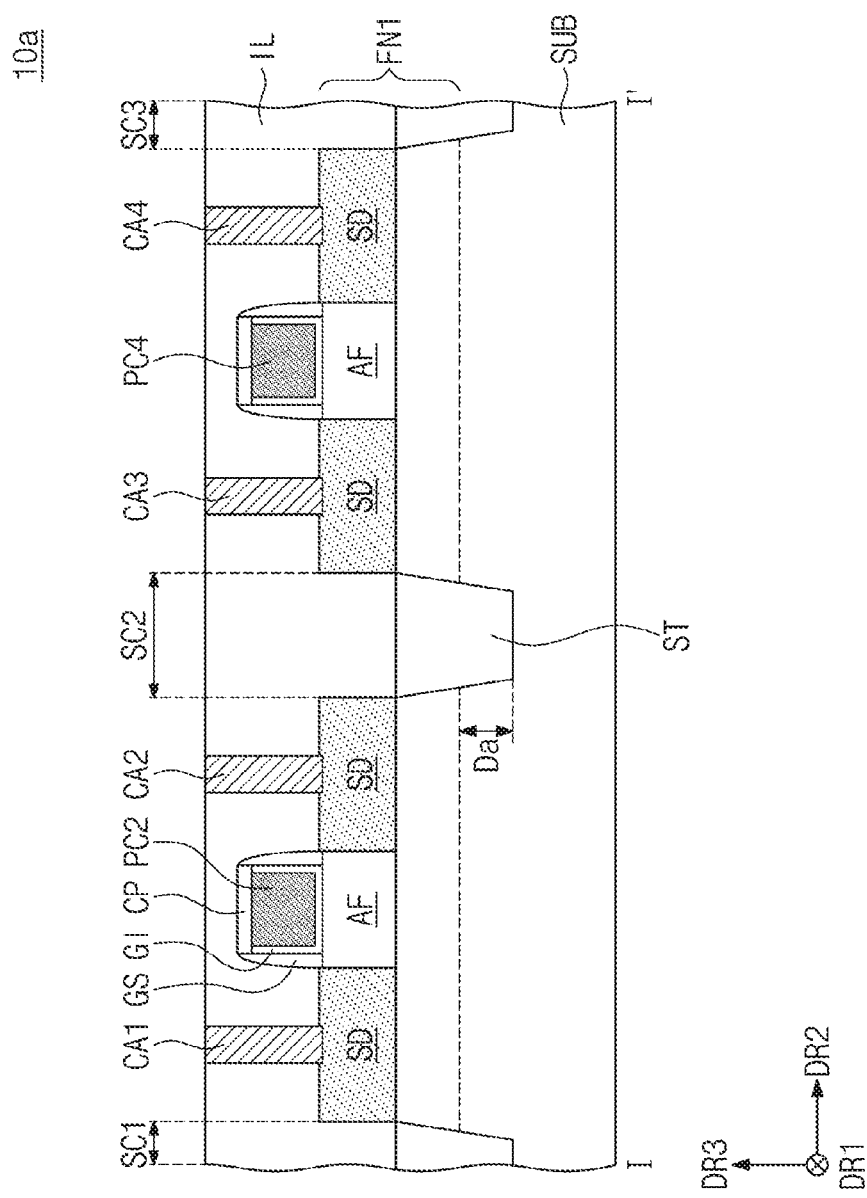
FIG. 3 is a sectional view taken along a line I-I' of FIG. 2.

FIG. 3 is a sectional view taken along a line I-I' of FIG. 2. Referring to FIG. 3, a standard cell 10a may include a substrate SUB, the first fin FN1, the second and fourth gate patterns PC2 and PC4, a gate insulating pattern GI, a gate spacer GS, a capping pattern CP, the first to fourth contact patterns CA1 to CA4, an isolation layer ST, and an insulating layer IL. A trench may be formed in each of the first to third single diffusion break regions SC1 to SC3 of the standard cell 10a. The insulating layer IL may be formed on the substrate SUB, the first fin FN1, the second and fourth gate patterns PC2 and PC4, the gate insulating pattern GI, the gate spacer GS, the capping pattern CP, and the isolation layer ST.

The substrate SUB may be a semiconductor substrate. For example, the substrate SUB may be, but is not limited to, a P-type semiconductor substrate. For example, the substrate SUB may be an N-type semiconductor substrate. Trenches having a first cutting depth Da to the third direction DR3 may be formed in the first to third single diffusion break regions SC1 to SC3 of the substrate SUB. The first fin FN1 may be cut by the first to third single diffusion break regions SC1 to SC3. The isolation layer ST may be filled in the trenches formed in the first to third single diffusion break regions SC1 to SC3. The first to third single diffusion break regions SC1 to SC3 may be insulated by the isolation layer ST.

The first cutting depth Da may correspond to the maximum cutting depth in the first to third single diffusion break regions SC1 to SC3. The first cutting depth Da may be defined as the maximum cutting depth of the substrate SUB in the first to third single diffusion break regions SC1 to SC3. A width of the trenches in the second direction DR2 may depend on a width of a gate pattern in the second direction DR2. In FIG. 3, two active regions that are insulated from each other may be defined by the trenches. For example, a first active region may be formed between the first single diffusion break region SC1 and the second single diffusion break region SC2, and a second active region may be formed between the second single diffusion break region SC2 and the third single diffusion break region SC3.

The first fin FN1 is formed on the substrate SUB to have a FinFET structure. The first fin FN1 may have a structure protruding from the substrate SUB in the third direction DR3. The first fin FN1 may be doped with n+ or p+. The first fin FN1 may be cut and separated in the first to third single diffusion break regions SC1 to SC3. The second to fourth fins FN2 to FN4 of FIG. 2 may have the same structure as the first fin FN1. Isolation layers may be formed between the first to fourth fins FN1 to FN4.

The first fin FN1 may include source/drain regions SD and channel regions AF. The source/drain regions SD and the channel regions AF may be provided at an upper portion of the first fin FN1. A pair of source/drain regions SD may be formed on opposite sides of each of the second and fourth gate patterns PC2 and PC4. The source/drain regions SD may be formed to partially overlap the first to fourth contact patterns CA1 to CA4 in the third direction DR3. The channel region AF may be formed between a pair of source/drain regions SD. The channel region AF may be formed to overlap the second and fourth gate patterns PC2 and PC4 in the third direction DR3. In the case where the second and fourth gate patterns PC2 and PC4 are dummy gate patterns, a depletion region may be formed instead of the channel region AF.

The second gate pattern PC2 and the fourth gate pattern PC4 may extend while crossing the first fin FN1. The second gate pattern PC2 and the fourth gate pattern PC4 may be disposed on the first fin FN1, with the insulation pattern GI interposed therebetween. In a region where the first fin FN1 is not formed, the second gate pattern PC2 and the fourth gate pattern PC4 may be disposed on the substrate SUB, with the insulation pattern GI interposed therebetween. The second gate pattern PC2 and the fourth gate pattern PC4 may include at least one of doped semiconductor, metal, and metal nitride.

The gate insulating pattern GI may be used as a gate insulating layer that electrically insulates the second and fourth gate patterns PC2 and PC4 from the first fin FN1. The gate insulating pattern GI may extend in the third direction DR3 to cover opposite sidewalls of each of the second and fourth gate patterns PC2 and PC4. The gate spacers GS may be disposed on opposite sides of each of the second and fourth gate patterns PC2 and PC4 in the second direction DR2. The gate spacers GS may face the second and fourth gate patterns PC2 and PC4 in a state where the gate insulating pattern GI is are interposed between the gate space GS and the gate pattern PC2/PC4. The capping pattern CP may be disposed to cover upper surfaces of the second and fourth gate patterns PC2 and PC4. The gate insulating pattern GI, the gate spacer GS, and the capping pattern CP may include silicon oxide, silicon nitride, or SiON.

The first contact pattern CA1 and the second contact pattern CA2 are disposed adjacent to the second gate pattern PC2 in the second direction DR2. The first contact pattern CA1 and the second contact pattern CA2 may be disposed on the first fin FN1 or the substrate SUB. The second gate pattern PC2 is interposed between the first contact pattern CA1 and the second contact pattern CA2. The first contact pattern CA1, the second gate pattern PC2, and the second contact pattern CA2 may form a transistor together with the source/drain regions SD and the channel region AF of the first fin FN1.

The third contact pattern CA3 and the fourth contact pattern CA4 are disposed adjacent to the fourth gate pattern PC4 in the second direction DR2. The third contact pattern CA3 and the fourth contact pattern CA4 may be disposed on the first fin FN1 or the substrate SUB. The fourth gate pattern PC4 is interposed between the third contact pattern CA3 and the fourth contact pattern CA4. The third contact pattern CA3, the fourth gate pattern PC4, and the fourth contact pattern CA4 may form a transistor together with the source/drain regions SD and the channel region AF of the first fin FN1.

Figure 4:
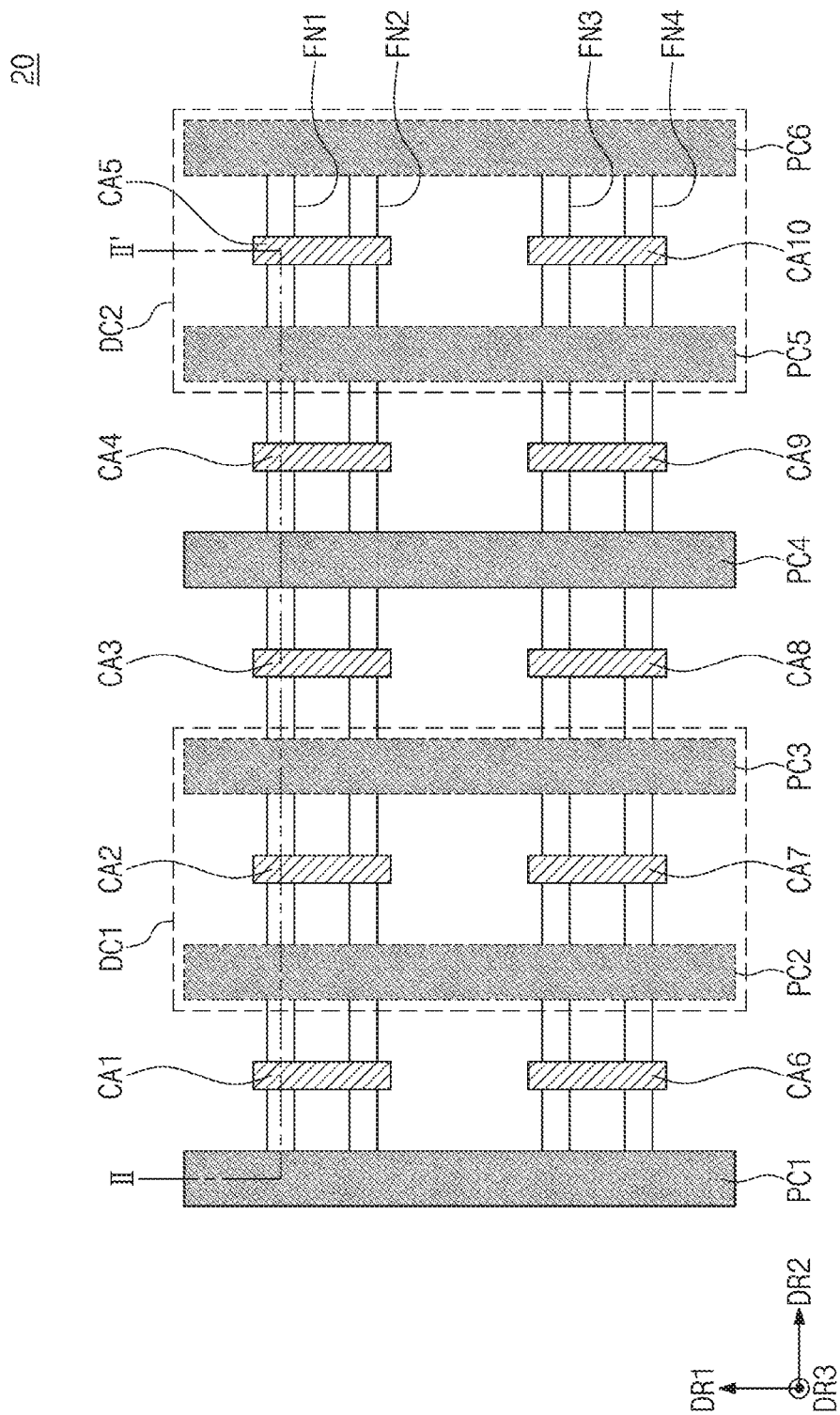
FIG. 4 is a view for describing a standard cell in which a double diffusion break region is formed.

FIG. 4 is a view for describing a standard cell in which a double diffusion break region is formed. That is, FIG. 4 is a view for describing the second element region 122 in the second standard cell 120 of FIG. 1. Referring to FIG. 4, a standard cell 20 may include first to sixth gate patterns PC1 to PC6, first to fourth fins FN1 to FN4, and first to tenth contact patterns CA1 to CA10. It may be understood that the number of gate patterns, the number of fins, and the number of contact patterns are determined for convenience of description. That is, the standard cell 20 may include gate patterns, fins, and contact patterns, which may be variously changed or modified in number.

The first to sixth gate patterns PC1 to PC6 extend in the first direction DR1. The first to sixth gate patterns PC1 to PC6 may be disposed in parallel and may be spaced apart from each other in the second direction DR2. The second gate pattern PC2 and the third gate pattern PC3 may be included in a first double diffusion break region DC1. The fifth gate pattern PC5 and the sixth gate pattern PC6 may be included in a second double diffusion break region DC2. That is, the second gate pattern PC2, the third gate pattern PC3, the fifth gate pattern PC5, and the sixth gate pattern PC6 may be dummy gate patterns. A trench may be formed in each of the first and second double diffusion break regions DC1 and DC2 and may be filled with an isolation layer. Each of the first gate pattern PC1 and the fourth gate pattern PC4 may be used as a gate terminal of a transistor element.

The first to fourth fins FN1 to FN4 extend in the second direction DR2. The first to fourth fins FN1 to FN4 may be disposed in parallel and may be spaced apart from each other in the first direction DR1. The first fin FN1 and the second fin FN2 may be electrically connected with the first to fifth contact patterns CA1 to CA5. The third fin FN3 and the fourth fin FN4 may be electrically connected with the sixth to tenth contact patterns CA6 to CA10. The first to fourth fins FN1 to FN4 may be cut by the first and second double diffusion break regions DC1 and DC2.

The first to tenth contact patterns CA1 to CA10 extend in the first direction DR1. The first to tenth contact patterns CA1 to CA10 may be disposed in parallel and may be spaced apart from each other in the second direction DR2. The second contact pattern CA2 and the seventh contact pattern CA7 may be included in the first double diffusion break region DC1 and may be removed by forming a trench. The fifth contact pattern CA5 and the tenth contact pattern CA10 may be included in the second double diffusion break region DC2 and may be removed by forming a trench.

Each of the first contact pattern CA1, the third and fourth contact patterns CA3 and CA4, the sixth contact pattern CA6, and the eighth and ninth contact patterns CA8 and CA9 may be used as a source terminal or a drain terminal of a transistor element. The first contact pattern CA1 and the third contact pattern CA3 may be electrically insulated by the first double diffusion break region DC1. The sixth contact pattern CA6 and the eighth contact pattern CA8 may be electrically insulated by the first double diffusion break region DC1. A region that is electrically insulated by using a double diffusion break region may be determined.

Figure 5:
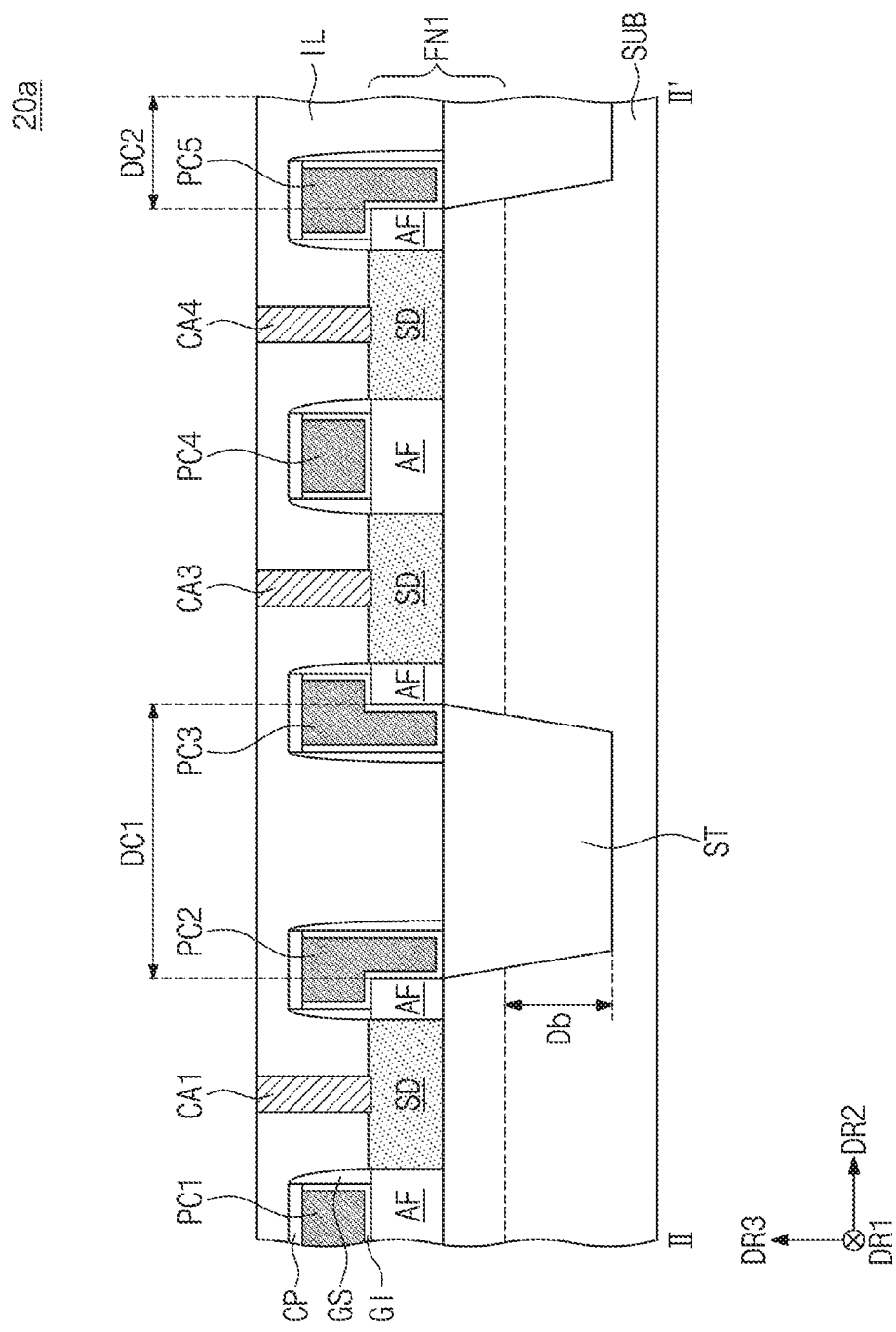
FIG. 5 is a sectional view taken along a line II-II' of FIG. 4.

FIG. 5 is a sectional view taken along a line II-Ir of FIG. 4. Referring to FIG. 5, a standard cell 20a may include the substrate SUB, the first fin FN1, the first to fifth gate patterns PC1 to PC5, a gate insulating pattern GI, a gate spacer GS, a capping pattern CP, the first contact pattern CAL the third and fourth contact patterns CA3 and CA4, an isolation layer ST, and an insulating layer IL. A trench may be formed in each of the first and second double diffusion break regions DC1 and DC2 of the standard cell 20a. The insulating layer IL may be formed on the substrate SUB, the first fin FN1, the first to fifth gate patterns PC1 to PC5, the gate insulating pattern GI, the gate spacer GS, the capping pattern CP, and the isolation layer ST.

The substrate SUB may be a semiconductor substrate and may be substantially the same as the substrate SUB of FIG. 3. Trenches having a second cutting depth Db to the third direction DR3 may be formed in the first and second double diffusion break regions DC1 and DC2 of the substrate SUB. The first fin FN1 may be cut by the first and second double diffusion break regions DC1 and DC2. The isolation layer ST may be filled in the trenches formed in the first and second double diffusion break regions DC1 and DC2. The first and second double diffusion break regions DC1 and DC2 may be insulated by the isolation layer ST.

The second cutting depth Db may correspond to the maximum cutting depth in the first and second double diffusion break regions DC1 and DC2. The second cutting depth Db may be defined as the maximum cutting depth of the substrate SUB in the first and second double diffusion break regions DC1 and DC2. A width of the trenches in the second direction DR2 may depend on a distance between two gate patterns, which are disposed adjacent to each other, in the second direction DR2, that is, a distance between the second gate pattern PC2 and the third gate pattern PC3. In FIG. 5, two active regions that are insulated from each other may be defined by the trenches. For example, a first active region and a second active region that are adjacent in the second direction DR2 may be formed with the first double diffusion break region DC1 interposed therebetween.

The first fin FN1 is formed on the substrate SUB to have a FinFET structure. Like the first fin FN1 of FIG. 3, the first fin FN1 may have a structure protruding from the substrate SUB in the third direction DR3. The first fin FN1 may be cut and separated in the first and second double diffusion break regions DC1 and DC2. The second to fourth fins FN2 to FN4 of FIG. 4 may have the same structure as the first fin FN1. The first fin FN1 may include source/drain regions SD and channel regions AF, and the source/drain regions SD and the channel regions AF may perform substantially the same function as the source/drain regions SD and the channel regions AF of FIG. 3.

The first to fifth gate patterns PC1 to PC5 extend in the first direction DR1 while crossing the first fin FN1. The first to fifth gate patterns PC1 to PC5 may be disposed on the first fin FN1, with the insulation pattern GI interposed therebetween. In a region where the first fin FN1 is not formed, the first gate pattern PC1 and the fourth gate pattern PC4 may be disposed on the substrate SUB, with the insulation pattern GI interposed therebetween. The first and fourth gate patterns PC1 and PC4 may be substantially the same as the second and fourth gate patterns PC2 and PC4 of FIG. 3. Also, the gate insulating pattern GI, the gate spacer GS, and the capping pattern CP may be substantially the same as the gate insulating pattern GI, the gate spacer GS, and the capping pattern CP of FIG. 3.

The first contact pattern CA1 is disposed adjacent to the first gate pattern PC1 in the second direction DR2. The third contact pattern CA3 and the fourth contact pattern CA4 are disposed adjacent to the fourth gate pattern PC4 in the second direction DR2. The first contact pattern CAL the third contact pattern CA3, and the fourth contact pattern CA4 may be disposed on the first fin FN1 or the substrate SUB. The first contact pattern CA1, the third contact pattern CA3, and the fourth contact pattern CA4 may be substantially the same as the first to fourth contact patterns CA1 to CA4 of FIG. 3.

The single diffusion break region of FIG. 3 and the double diffusion break region of FIG. 5 are different from each other in that cutting depths formed in the third direction DR3 are different from each other. The first cutting depth Da is smaller than the second cutting depth Db. Also, a width of a trench in the second direction DR2, which is formed in the single diffusion break region, is smaller than a width of a trench in the second direction DR2, formed in the double diffusion break region. Since one gate pattern is used in the single diffusion break region, a trench that is narrow in the second direction DR2 and is shallow in the third direction DR3 is formed. Since two gate patterns are used in the double diffusion break region, a trench that is wide in the second direction DR2 and is deep in the third direction DR3 is formed.

Figure 6:
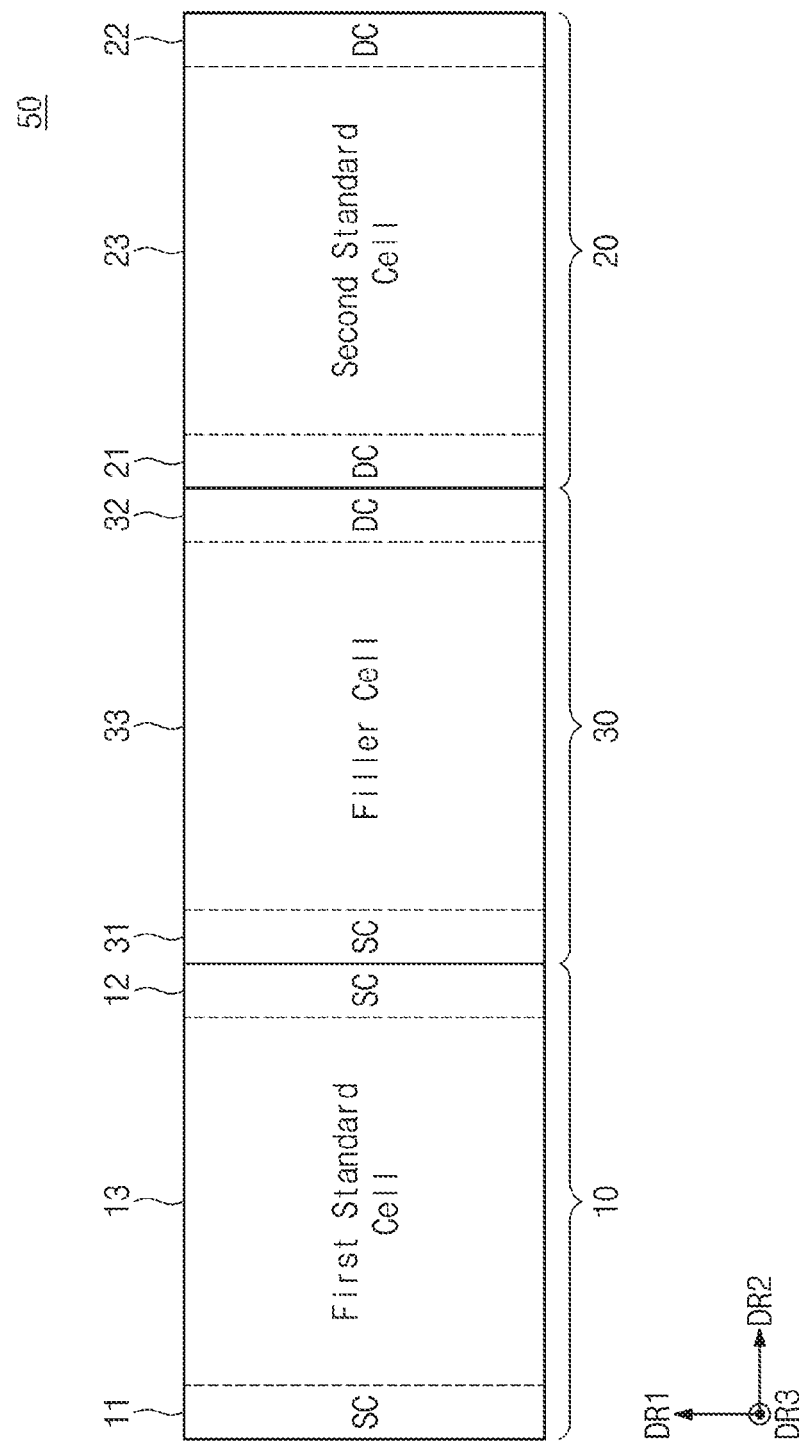
FIG. 6 is a view illustrating a layout of a semiconductor device including a first standard cell and a second standard cell.

FIG. 6 is a view illustrating a layout of a semiconductor device including a first standard cell and a second standard cell. Referring to FIG. 6, a semiconductor device 50 includes the first standard cell 10, the second standard cell 20, and a filler cell 30. The first standard cell 10 may include a first edge region 11, a second edge region 12, and a first element region 13. The second standard cell 20 may include a third edge region 21, a fourth edge region 22, and a second element region 23. The filler cell 30 may include a fifth edge region 31, a sixth edge region 32, and a dummy region 33.

The first edge region 11 is disposed adjacent to the first element region 13 in the second direction DR2. The second edge region 12 is disposed adjacent to the filler cell 30 in the second direction DR2. The first element region 13 is interposed between the first edge region 11 and the second edge region 12. The first element region 13 may be substantially the same as the first element region 112 of FIG. 1.

Each of the first edge region 11 and the second edge region 12 may include a single diffusion break region SC. That is, all of the first edge region 11, the second edge region 12, and the first element region 13 included in the first standard cell 10 may be formed by a single diffusion break region. A trench having the first cutting depth Da may be formed in each of the first edge region 11 and the second edge region 12. A trench formed in the second edge region 12 may insulate the first element region 13 and the second element region 23.

The third edge region 21 is disposed adjacent to the filler cell 30 in the second direction DR2. The third edge region 21 is interposed between the filler cell 30 and the second element region 23. The fourth edge region 22 is disposed adjacent to the second element region 23 in the second direction DR2. The second element region 23 is interposed between the third edge region 21 and the fourth edge region 22. The second element region 23 may be substantially the same as the second element region 122 of FIG. 2.

Each of the third edge region 21 and the fourth edge region 22 may include a double diffusion break region DC. That is, all of the third edge region 21, the fourth edge region 22, and the second element region 23 included in the second standard cell 20 may be formed by a double diffusion break region. A trench having the second cutting depth Db may be formed in each of the third edge region 21 and the fourth edge region 22. A trench formed in the third edge region 21 may insulate the first element region 13 and the second element region 23.

The filler cell 30 is interposed between the first standard cell 10 and the second standard cell 20. The fifth edge region 31 may be adjacent to the second edge region 12 in the second direction DR2. The fifth edge region 31 may include a single diffusion break region SC. The sixth edge region 32 may be adjacent to the third edge region 21 in the second direction DR2. The sixth edge region 32 may include a double diffusion break region DC. The dummy region 33 is interposed between the fifth edge region 31 and the sixth edge region 32.

The second edge region 12 of the first standard cell 10 has the first cutting depth Da of FIG. 3 in the third direction DR3, and the third edge region 21 of the second standard cell 20 has the second cutting depth Db of FIG. 5 in the third direction DR3. In the case where the first standard cell 10 and the second standard cell 20 are disposed adjacent to each other upon a design of an integrated circuit of a semiconductor device based on standard cells, an edge region of the first standard cell 10 and an edge region of the second standard cell 20 may have different cutting depths. The filler cell 30 may include the fifth edge region 31 having the first cutting depth Da and may include the sixth edge region 32 having the second cutting depth Db. In this case, the stress due to different cutting depths may decrease. However, the area of the semiconductor device 50 may increase due to the filler cell 30.

Figure 7:
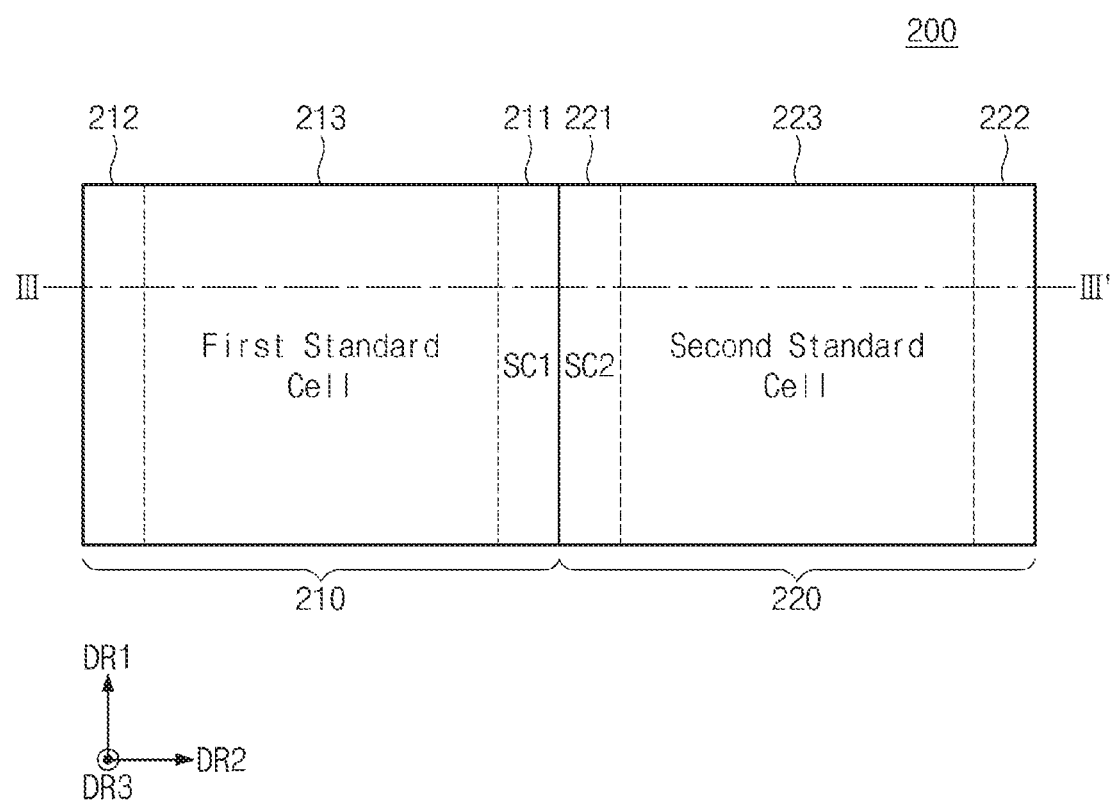
FIG. 7 is a view for describing a layout of a semiconductor device according to an embodiment of the inventive concepts.

FIG. 7 is a view for describing a layout of a semiconductor device according to an embodiment of the inventive concepts. Referring to FIG. 7, a semiconductor device 200 includes a first standard cell 210 and a second standard cell 220. The first standard cell 210 may include a first edge region 211, a second edge region 212, and a first element region 213. Like the first element region 112 of FIG. 1, the first element region 213 may be formed based on a single diffusion break region. The second standard cell 220 may include a third edge region 221, a fourth edge region 222, and a second element region 223. Like the second element region 122 of FIG. 1, the second element region 223 may be formed based on a double diffusion break region.

The first edge region 211 may extend in the first direction DR1. The first edge region 211 may be in contact with the third edge region 221 of the second standard cell 220 adjacent in the second direction DR2. The first edge region 211 may include a first single diffusion break region SC1 that electrically insulates the first element region 213 from the second element region 223. That is, the first edge region 211 may be cut to form a trench in the third direction DR3. The cut region of the first edge region 211 may be filled with an isolation layer.

The second edge region 212 may extend in the first direction DR1. The second edge region 212 may be in contact with another standard cell (not illustrated) adjacent in the second direction DR2. In this case, the second edge region 212 is interposed between the first element region 213 and another standard cell. The second edge region 212 may include a single diffusion break region that electrically insulates the first element region 213 from another standard cell. Alternatively, the second edge region 212 may include a double diffusion break region. A type of the diffusion break region included in the second edge region 212 may depend on a type of a diffusion break region of an edge region in an adjacent standard cell.

Alternatively, the second edge region 212 may include a signal contact pattern. In this case, the first standard cell 210 may receive an operation signal for driving the first element region 213 by using the signal contact pattern. Alternatively, the second edge region 212 may include a power contact pattern. In this case, the first standard cell 210 may be supplied with a power supply voltage for driving the first element region 213 through the power contact pattern. A type of a contact pattern included in the second edge region 212 may depend on a type of a contact pattern of an edge region in another standard cell (not illustrated) adjacent to the second edge region 212 in the second direction DR2.

The third edge region 221 may extend in the first direction DR1. The third edge region 221 may be in contact with the first edge region 211 of the first standard cell 210 adjacent in the second direction DR2. The third edge region 221 may include a second single diffusion break region SC2 that electrically insulates the second element region 223 from the first element region 213. That is, the third edge region 221 may be cut to form a trench in the third direction DR3. The cut region of the third edge region 221 may be filled with an isolation layer.

Both the trench formed in the third edge region 221 and the trench formed in the first edge region 211 may have a cutting depth that is based on single diffusion break. That is, the maximum cutting depth of the first edge region 211 in the third direction DR3 may be the same as the maximum cutting depth of the third edge region 221 in the third direction DR3. Also, a thickness in the third direction DR3 of a substrate in the first edge region 211 may be the same as a thickness in the third direction DR3 of the substrate in the third edge region 221. Accordingly, the stress occurring in an isolation layer filled in the first edge region 211 and the third edge region 221 may be reduced or minimized.

The fourth edge region 222 may extend in the first direction DR1. The fourth edge region 222 may be in contact with another standard cell (not illustrated) adjacent in the second direction DR2. In this case, the fourth edge region 222 is interposed between the second element region 223 and another standard cell. The fourth edge region 222 may include a single diffusion break region that electrically insulates the second element region 223 from another standard cell. Alternatively, the fourth edge region 222 may include a double diffusion break region. Alternatively, like the second edge region 212, the fourth edge region 222 may include a signal contact pattern or a power contact pattern.

A type of a diffusion break region or a contact pattern included in the fourth edge region 222 may depend on a type of a diffusion break region or a contact pattern of an edge region in a standard cell adjacent to the fourth edge region 222. The second edge region 212 and the fourth edge region 222 may have the same diffusion break region or may have different diffusion break regions. However, since a type of each of the second edge region 212 and the fourth edge region 222 depends on a type of an edge region of an adjacent standard cell, the second edge region 212 and the fourth edge region 222 may be implemented to have different types.

Figure 8:
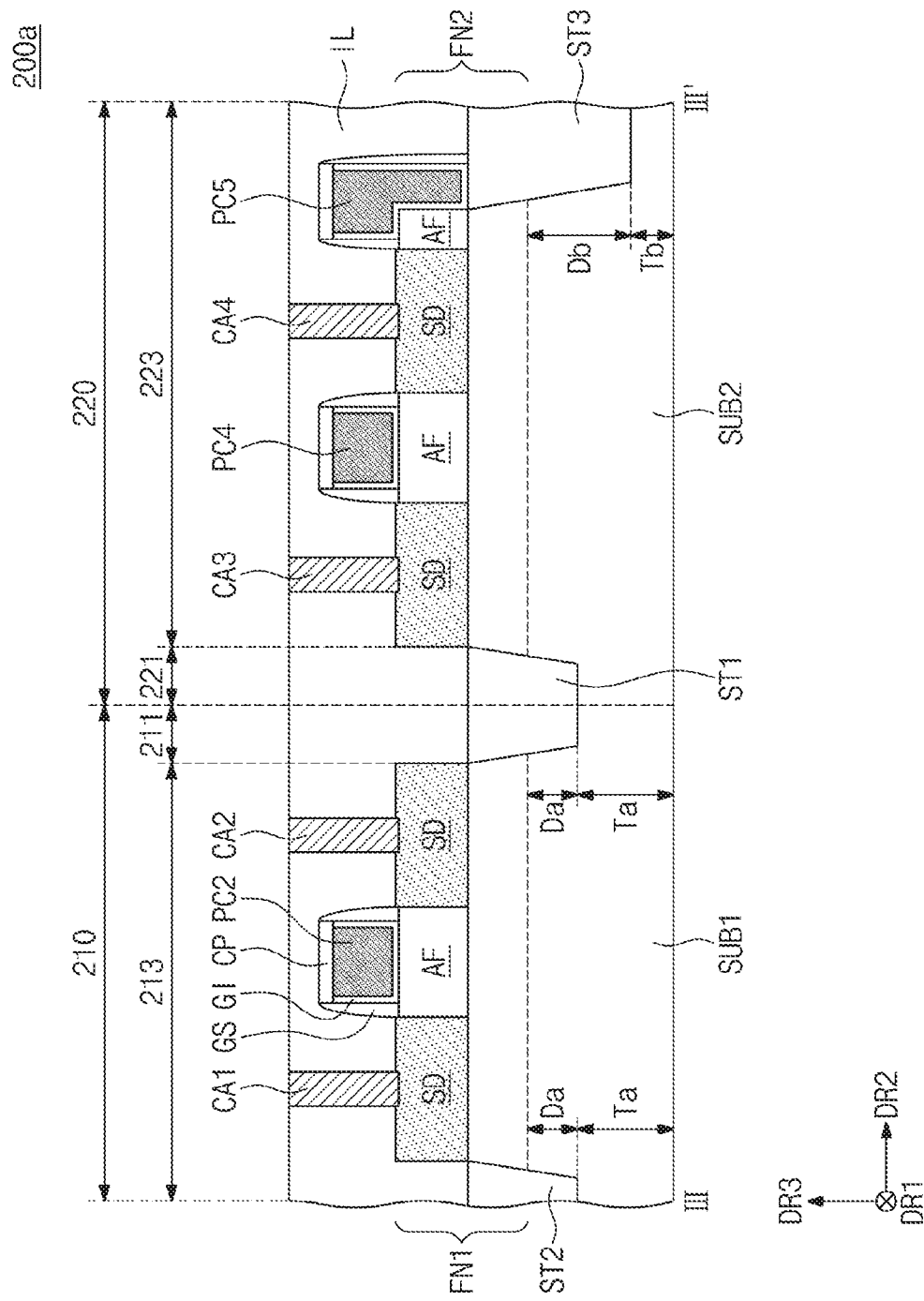
FIG. 8 is a sectional view taken along a line of FIG. 7.

FIG. 8 is a sectional view taken along a line of FIG. 7. Referring to FIG. 8, a semiconductor device 200a includes the first standard cell 210 and the second standard cell 220. The first standard cell 210 may be divided into the first edge region 211 and the first element region 213 with respect to the second direction DR2. The second standard cell 220 may be divided into the third edge region 221 and the second element region 223 with respect to the second direction DR2. In FIG. 8, for convenience of description, a region where the first standard cell 210 and the second standard cell 220 are adjacent to each other is illustrated in detail, and the second edge region 212 and the fourth edge region 222 are omitted.

A substrate may be divided into a region where the first standard cell 210 is formed and a region where the second standard cell 220 is formed. For convenience of description, a region of the substrate, in which the first standard cell 210 is formed, is defined as a first substrate SUB1, and a region of the substrate, in which the second standard cell 220 is formed, is defined as a second substrate SUB2.

The first standard cell 210 may include a first fin FN1 formed on the first substrate SUB1, a second gate pattern PC2, and first and second contact patterns CA1 and CA2. The first fin FN1, the second gate pattern PC2, and the first and second contact patterns CA1 and CA2 of the first element region 213 are substantially the same as the first fin FN1, the second gate pattern PC2, and the first and second contact patterns CA1 and CA2 of FIG. 3, and thus, a description thereof will not be repeated here.

The first element region 213 may include a single diffusion break region in which a trench having the first cutting depth Da in the third direction DR3 is formed. Also, the first edge region 211 may include a first single diffusion break region in which a trench having the first cutting depth Da in the third direction DR3 is formed. The first substrate SUB1 may have a first minimum thickness Ta in the third direction DR3 in the single diffusion break region of the first element region 213 and the first single diffusion break region of the first edge region 211.

The second standard cell 220 may include a second fin FN2 formed on the second substrate SUB2, a fourth gate pattern PC4, a fifth gate pattern PC5, and third and fourth contact patterns CA3 and CA4. The second fin FN2, the fourth gate pattern PC4, the fifth gate pattern PC5, and the third and fourth contact patterns CA3 and CA4 of the second element region 223 are substantially the same as the first fin FN1, the fourth gate pattern PC4, the fifth gate pattern PC5, and the third and fourth contact patterns CA3 and CA4 of FIG. 5, and thus, a description thereof will not be repeated here.

The second element region 223 may include a double diffusion break region in which a trench having the second cutting depth Db in the third direction DR3 is formed. The second cutting depth Db is greater than the first cutting depth Da. In other words, since the double diffusion break region is cut depending on a distance between two gate patterns, the double diffusion break region has a wider cutting region than the single diffusion break region. For this reason, the second cutting depth Db is greater than the first cutting depth Da. In the second element region 223, the second substrate SUB2 may have a second minimum thickness Tb in the third direction DR3. The second minimum thickness Tb may be smaller than the first minimum thickness Ta.

The third edge region 221 may include a second single diffusion break region in which a trench having the first cutting depth Da in the third direction DR3 is formed. The first single diffusion break region and the second single diffusion break region may have the same cutting depth. In the third edge region 221, the second substrate SUB2 may have the first minimum thickness Ta in the third direction DR3. A trench based on one gate pattern may be formed in the first edge region 211 and the third edge region 221. The first edge region 211 and the third edge region 221 may be formed by the STI process. For example, the first edge region 211 and the third edge region 221 may be simultaneously formed in an etching process.

The semiconductor device 200a may further include first to third isolation layers ST1 to ST3. A first isolation layer ST1 is disposed on the first and second substrates SUB1 and SUB2. The first isolation layer ST1 may fill a trench formed in the first edge region 211 and the third edge region 221. A second isolation layer ST2 is disposed on the first substrate SUB1. The second isolation layer ST2 may fill a trench formed in a single diffusion break region of the first element region 213. The third isolation layer ST3 is disposed on the second substrate SUB2. The third isolation layer ST3 may fill a trench formed in a double diffusion break region of the second element region 223. The maximum width of the third isolation layer ST3 in the second direction DR2 is greater than the maximum width of the first isolation layer ST1 and the second isolation layer ST2 in the second direction DR2.

Figure 9:
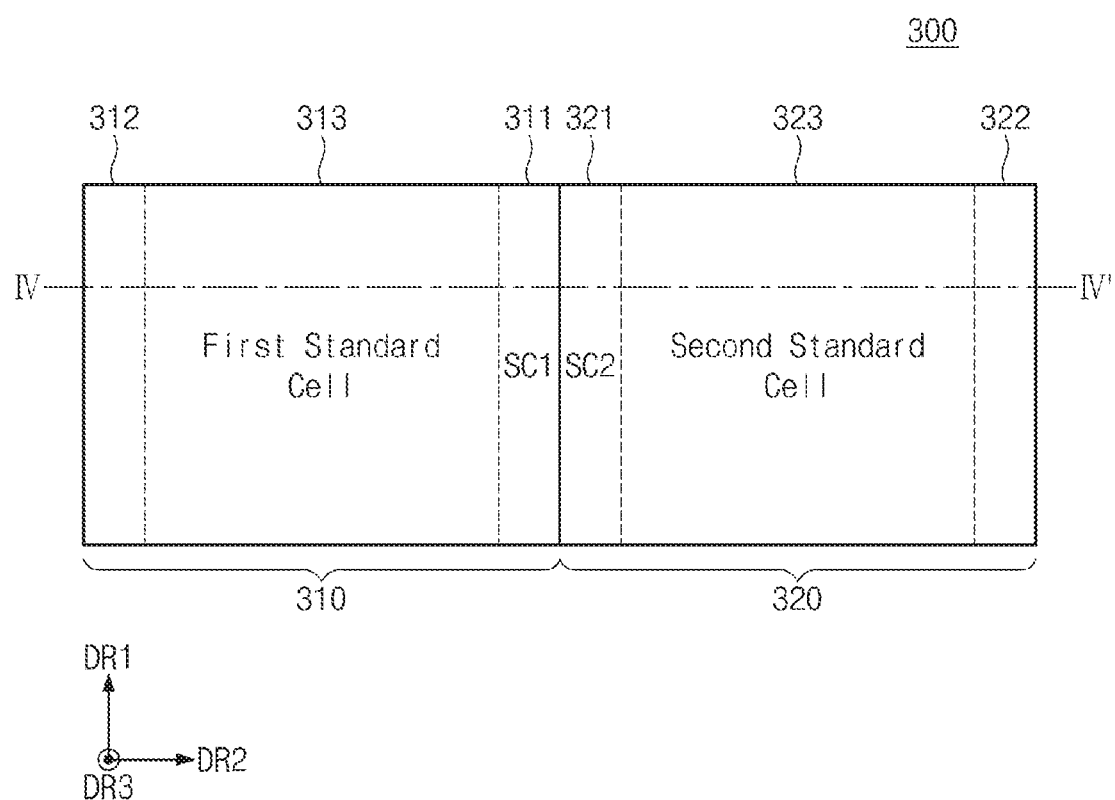
FIG. 9 is a view for describing a layout of a semiconductor device according to an embodiment of the inventive concepts.

FIG. 9 is a view for describing a layout of a semiconductor device according to an embodiment of the inventive concepts. Referring to FIG. 9, a semiconductor device 300 includes a first standard cell 310 and a second standard cell 320. The first standard cell 310 may include a first edge region 311, a second edge region 312, and/or a first element region 313. The first element region 313 may be substantially the same as the first element region 213 of FIG. 7. The second standard cell 320 may include a third edge region 321, a fourth edge region 322, and/or a second element region 323. The second element region 323 may be substantially the same as the second element region 223 of FIG. 7.

The first edge region 311 may extend in the first direction DR1. The first edge region 311 may be in contact with the third edge region 321 of the second standard cell 320 adjacent in the second direction DR2. The first edge region 311 may include a first double diffusion break region DC1 that electrically insulates the first element region 313 from the second element region 323. That is, the first edge region 311 may be cut to form a trench in the third direction DR3. The cut region of the first edge region 311 may be filled with an isolation layer.

The second edge region 312 may extend in the first direction DR1. The second edge region 312 may be in contact with another standard cell (not illustrated) adjacent in the second direction DR2. The second edge region 312 may include at least one of a single diffusion break region, a double diffusion break region, a signal contact pattern, and a power contact pattern.

The third edge region 321 may extend in the first direction DR1. The third edge region 321 may be in contact with the first edge region 311 of the first standard cell 310 adjacent in the second direction DR2. The third edge region 321 may include a second double diffusion break region DC2 that electrically insulates the second element region 323 from the first element region 313. That is, the third edge region 321 may be cut to form a trench in the third direction DR3. The cut region of the third edge region 321 may be filled with an isolation layer.

Both the trench formed in the third edge region 321 and the trench formed in the first edge region 311 may have a cutting depth that is based on double diffusion break. That is, the maximum cutting depth of the first edge region 311 in the third direction DR3 may be the same as the maximum cutting depth of the third edge region 321 in the third direction DR3. Also, a thickness in the third direction DR3 of a substrate in the first edge region 311 may be the same as a thickness in the third direction DR3 of the substrate in the third edge region 321. Accordingly, the stress occurring in an isolation layer filled in the first edge region 311 and the third edge region 321 may be reduced or minimized.

The fourth edge region 322 may extend in the first direction DR1. The fourth edge region 322 may be in contact with another standard cell (not illustrated) adjacent in the second direction DR2. The fourth edge region 322 may include at least one of a single diffusion break region, a double diffusion break region, a signal contact pattern, and a power contact pattern.

Figure 10:
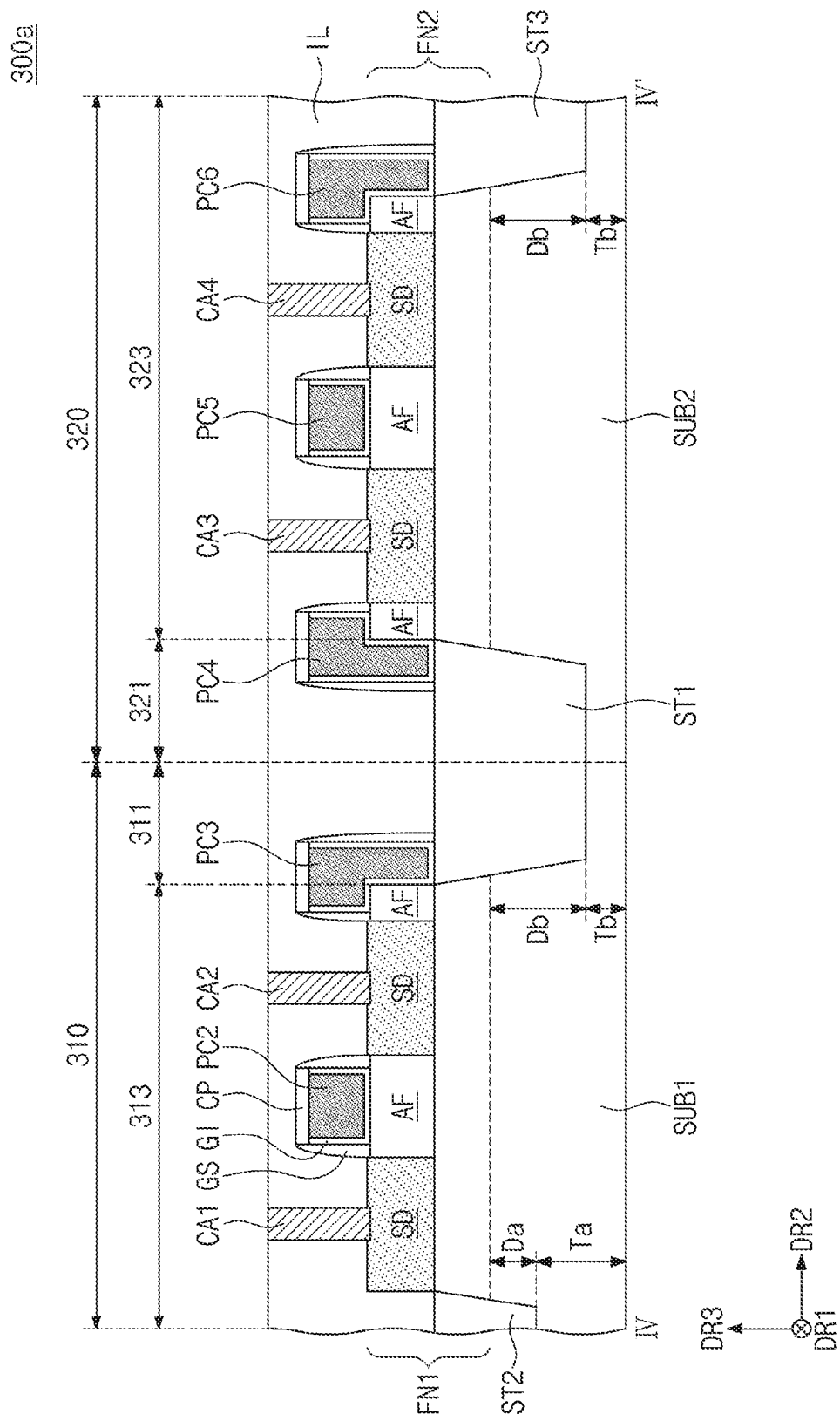
FIG. 10 is a sectional view taken along a line IV-IV' of FIG. 9.

FIG. 10 is a sectional view taken along a line IV-IV' of FIG. 9. Referring to FIG. 10, a semiconductor device 300a includes the first standard cell 310 and the second standard cell 320. The first standard cell 310 may be divided into the first edge region 311 and the first element region 313 with respect to the second direction DR2. The second standard cell 320 may be divided into the third edge region 321 and the second element region 323 with respect to the second direction DR2. In FIG. 10, for convenience of description, a region where the first standard cell 310 and the second standard cell 320 are adjacent to each other is illustrated in detail, and the second edge region 312 and the fourth edge region 322 are omitted.

A substrate may be divided into a region where the first standard cell 310 is formed and a region where the second standard cell 320 is formed. For convenience of description, a region of the substrate, in which the first standard cell 310 is formed, is defined as a first substrate SUB1, and a region of the substrate, in which the second standard cell 320 is formed, is defined as a second substrate SUB2.

The first standard cell 310 may include a first fin FN1 formed on the first substrate SUB1, second and third gate patterns PC2 and PC3, and first and second contact patterns CA1 and CA2. The first fin FN1, the second gate pattern PC2, and the first and second contact patterns CA1 and CA2 of the first element region 313 are substantially the same as those of the first element region 213 of FIG. 8, and thus, a description thereof will not be repeated here.

The first element region 313 may include a single diffusion break region in which a trench having the first cutting depth Da in the third direction DR3 is formed. In the first element region 313, the first substrate SUB1 may have the first minimum thickness Ta in the third direction DR3. Also, the first edge region 311 may include a first double diffusion break region in which a trench having the second cutting depth Db in the third direction DR3 is formed. To this end, a third gate pattern PC3 may be provided at the boundary between the first element region 313 and the first element region 311. In the first edge region 311, the first substrate SUB1 may have a second minimum thickness Tb in the third direction DR3. In the first edge region 311, the first cutting depth Da is smaller than the second cutting depth Db. The first minimum thickness Ta is greater than the second minimum thickness Tb.

The second standard cell 320 may include a second fin FN2 formed on the second substrate SUB2, fourth to sixth gate patterns PC4 to PC6, and third and fourth contact patterns CA3 and CA4. The second fin FN2, the fifth and sixth gate patterns PC5 and PC6, and the third and fourth contact patterns CA3 and CA4 of the second element region 323 are substantially the same as those of the second element region 223 of FIG. 8, and thus, a description thereof will not be repeated here.

The second element region 323 may include a double diffusion break region in which a trench having the second cutting depth Db in the third direction DR3 is formed. Also, the third edge region 321 may include a second double diffusion break region in which a trench having the second cutting depth Db in the third direction DR3 is formed. To this end, a fourth gate pattern PC4 may be provided at the boundary between the second element region 323 and the third edge region 321. The second substrate SUB2 may have the second minimum thickness Tb in the third direction DR3 in the double diffusion break region of the second element region 323 and the second double diffusion break region of the third element region 321.

The first double diffusion break region and the second double diffusion break region may have the same cutting depth. A trench based on a width between two gate patterns may be formed in the first edge region 311 and the third edge region 321. The third gate pattern PC3 and the fourth gate pattern PC4 may be provided to form a trench. The first edge region 311 and the third edge region 321 may be formed by the STI process. For example, the first edge region 311 and the third edge region 321 may be simultaneously formed in an etching process.

The semiconductor device 300a may further include first to third isolation layers ST1 to ST3. The first isolation layer ST1 is disposed on the first and second substrates SUB1 and SUB2. The first isolation layer ST1 may fill a trench formed in the first edge region 311 and the third edge region 321. The second isolation layer ST2 is disposed on the first substrate SUB1. The second isolation layer ST2 may fill a trench formed in a single diffusion break region of the first element region 313. The third isolation layer ST3 is disposed on the second substrate SUB2. The third isolation layer ST3 may fill a trench formed in a double diffusion break region of the second element region 223. The maximum width of the second isolation layer ST2 in the second direction DR2 is smaller than the maximum width of the first isolation layer ST1 and the third isolation layer ST3 in the second direction DR2.

Figure 11:
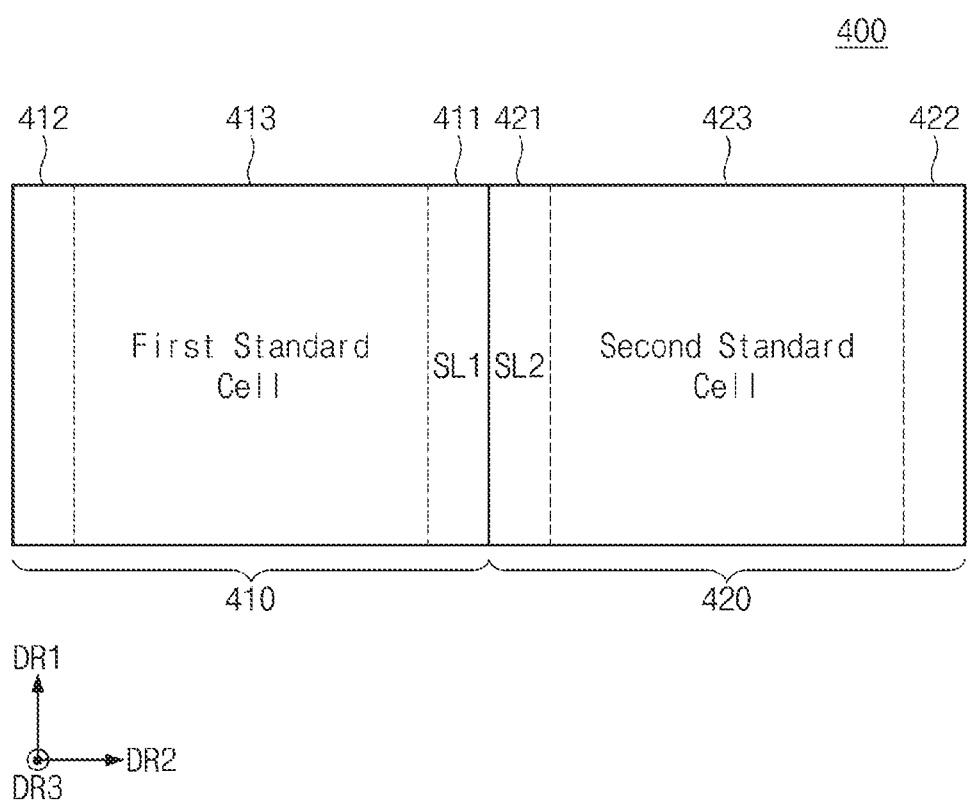
FIGS. 11 and 12 are views for describing layouts of a semiconductor device according to an embodiment of the inventive concepts.

FIG. 11 is a view for describing a layout of a semiconductor device according to an embodiment of the inventive concepts. Referring to FIG. 11, a semiconductor device 400 includes a first standard cell 410 and a second standard cell 420. The first standard cell 410 may include a first edge region 411, a second edge region 412, and/or a first element region 413. The first element region 413 may be substantially the same as the first element region 213 of FIG. 7. The second standard cell 420 may include a third edge region 421, a fourth edge region 422, and/or a second element region 423. The second element region 423 may be substantially the same as the second element region 223 of FIG. 7.

The first edge region 411 may extend in the first direction DR1. The first edge region 411 may be in contact with the third edge region 421 of the second standard cell 420 adjacent in the second direction DR2. The first edge region 411 may include a first signal contact pattern SL1. The first signal contact pattern SL1 may include a conductive material. The first standard cell 410 may receive an operation signal for driving the first element region 413 by using the first signal contact pattern SL1. For example, the operation signal may be a clock signal that is applied to a gate pattern included in the first element region 413. In this case, the first signal contact pattern SL1 may be electrically connected with the gate pattern included in the first element region 413. However, a kind of a signal that the first signal contact pattern SL1 provides to the first element region 413 or a configuration that the signal provides is not limited thereto.

The second edge region 412 may extend in the first direction DR1. The second edge region 412 may be in contact with another standard cell (not illustrated) adjacent in the second direction DR2. The second edge region 412 may include at least one of a single diffusion break region, a double diffusion break region, a signal contact pattern, and a power contact pattern.

The third edge region 421 may extend in the first direction DR1. The third edge region 421 may be in contact with the first edge region 411 of the first standard cell 410 adjacent in the second direction DR2. The third edge region 421 may include a second signal contact pattern SL2. Like the first signal contact pattern SL1, the second signal contact pattern SL2 may include a conductive material. The second standard cell 420 may receive an operation signal for driving the second element region 423 by using the second signal contact pattern SL2.

The first signal contact pattern SL1 and the second signal contact pattern SL2 may be electrically connected. The first signal contact pattern SL1 and the second signal contact pattern SL2 may be implemented with one signal contact pattern that provides an operation signal to the first and second element regions 413 and 423. A width of each of the first signal contact pattern SL1 and the second signal contact pattern SL2 in the second direction DR2 may be smaller than a width of a trench, which is formed in the first element region 413 or the second element region 423, in the second direction DR2. For example, the width of each of the first signal contact pattern SL1 and the second signal contact pattern SL2 in the second direction DR2 may be half the width of a single diffusion break region in the second direction DR2. In this case, since the semiconductor device 400 does not need a separate configuration for a transfer of an operation signal, the area need to implement the semiconductor device 400 may decrease.

The fourth edge region 422 may extend in the first direction DR1. The fourth edge region 422 may be in contact with another standard cell (not illustrated) adjacent in the second direction DR2. The fourth edge region 422 may include at least one of a single diffusion break region, a double diffusion break region, a signal contact pattern, and a power contact pattern.

Figure 12:
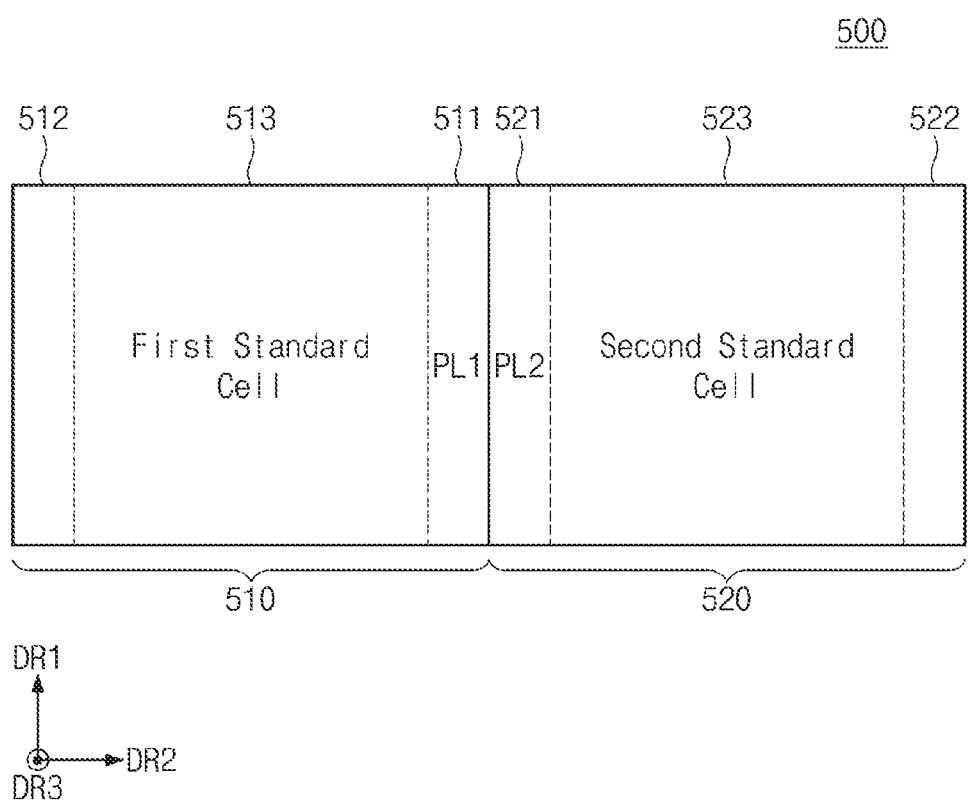

FIG. 12 is a view for describing a layout of a semiconductor device according to an embodiment of the inventive concepts. Referring to FIG. 12, a semiconductor device 500 includes a first standard cell 510 and a second standard cell 520. The first standard cell 510 may include a first edge region 511, a second edge region 512, and/or a first element region 513. The first element region 513 may be substantially the same as the first element region 213 of FIG. 7. The second standard cell 520 may include a third edge region 521, a fourth edge region 522, and/or a second element region 523. The second element region 523 may be substantially the same as the second element region 223 of FIG. 7.

The first edge region 511 may extend in the first direction DR1. The first edge region 511 may be in contact with the third edge region 521 of the second standard cell 520 adjacent in the second direction DR2. The first edge region 511 may include a first power contact pattern PL1. The first power contact pattern PL1 may include a conductive material. The first standard cell 510 may receive a power supply voltage for driving the first element region 513 by using the first power contact pattern PL1. For example, the power supply voltage may be applied to a fin included in the first element region 513. In this case, the first power contact pattern PL1 may be electrically connected with the fin included in the first element region 513. However, the inventive concepts are not limited thereto. For example, the power supply voltage may be provided to various elements included in the first element region 513 by using the first power contact pattern PL1.

The second edge region 512 may extend in the first direction DR1. The second edge region 512 may be in contact with another standard cell (not illustrated) adjacent in the second direction DR2. The second edge region 512 may include at least one of a single diffusion break region, a double diffusion break region, a signal contact pattern, and a power contact pattern.

The third edge region 521 may extend in the first direction DR1. The third edge region 521 may be in contact with the first edge region 511 of the first standard cell 510 adjacent in the second direction DR2. The third edge region 521 may include a second power contact pattern PL2. Like the first power contact pattern PL1, the second power contact pattern PL2 may include a conductive material. The second standard cell 520 may receive a power supply voltage for driving the second element region 523 by using the second power contact pattern PL2.

The first power contact pattern PL1 and the second power contact pattern PL2 may be electrically connected. The first power contact pattern PL1 and the second power contact pattern PL2 may be implemented with one power contact pattern that provides a power supply voltage to the first and second element regions 513 and 523. A width of each of the first power contact pattern PL1 and the second power contact pattern PL2 in the second direction DR2 may be smaller than a width of a trench, which is formed in the first element region 513 or the second element region 523, in the second direction DR2. For example, the width of each of the first power contact pattern PL1 and the second power contact pattern PL2 in the second direction DR2 may be half the width of a single diffusion break region in the second direction DR2. In this case, since the semiconductor device 500 does not need a separate configuration for supplying a power supply voltage, the area need to implement the semiconductor device 500 may decrease.

The fourth edge region 522 may extend in the first direction DR1. The fourth edge region 522 may be in contact with another standard cell (not illustrated) adjacent in the second direction DR2. The fourth edge region 522 may include at least one of a single diffusion break region, a double diffusion break region, a signal contact pattern, and a power contact pattern.

According to the semiconductor device described with reference to FIGS. 7 to 12, since edge regions of adjacent standard cells are designed to have the same cutting depth or the same contact pattern is formed, the area of the semiconductor device may decrease, and the stress in the edge region may be reduced or prevented. Also, the ease of design for implementation of an integrated circuit may be secured.

A semiconductor device according to an embodiment of the inventive concepts may secure integration, reliability, and/or stability by using a structure of each of edge regions of different standard cells.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A semiconductor device comprising:
a first element region including a single diffusion break region extending in a first direction, the single diffusion break region including a first trench having a first maximum depth in a depth direction perpendicular to the first direction;
a first edge region extending in the first direction and including a second trench in contact with the first element region in a second direction intersecting the first direction, the second trench having a second maximum depth in the depth direction;
a second element region including a double diffusion break region extending in the first direction, the double diffusion break region including a third trench having a third maximum depth in the depth direction; and
a second edge region extending in the first direction and including a fourth trench in contact with the second element region in the second direction, the fourth trench having the second maximum depth in the depth direction,
wherein the second trench is in contact with the fourth trench in the second direction.

2. The semiconductor device of claim 1, wherein the first element region further includes:

a gate pattern extending in the first direction and spaced apart from the single diffusion break region and the first edge region, and
wherein a width of the single diffusion break region depends on a width of the gate pattern.

3. The semiconductor device of claim 1, wherein the second element region further includes:
a first gate pattern extending in the first direction and spaced apart from the double diffusion break region and the second edge region; and
a second gate pattern extending in the first direction and spaced apart from the first gate pattern in the second direction, and
wherein a width of the double diffusion break region depends on a width between the first gate pattern and the second gate pattern.

4. The semiconductor device of claim 1, wherein the second maximum depth is the same as the first maximum depth.

5. The semiconductor device of claim 1, wherein the second maximum depth is the same as the third maximum depth.

6. The semiconductor device of claim 1, further comprising:
a third edge region extending in the first direction and contacting the first element region in the second direction; and
a fourth edge region extending in the first direction and contacting the second element region in the second direction, and
wherein the first element region is between the first edge region and the third edge region, and the second element region is between the second edge region and the fourth edge region.

7. The semiconductor device of claim 6, wherein the third edge region includes a fifth trench having the first maximum depth or the third maximum depth in the depth direction, and
wherein the fourth edge region includes a sixth trench having the first maximum depth or the third maximum depth in the depth direction.

8. The semiconductor device of claim 6, wherein at least one of the third edge region or the fourth edge region includes a signal contact pattern for providing a signal to the first element region or the second element region.

9. The semiconductor device of claim 6, wherein at least one of the third edge region or the fourth edge region includes a power contact pattern for providing a power supply voltage to the first element region or the second element region.

10. A semiconductor device comprising:
a first element region including a first diffusion break region on a substrate, the first diffusion break region including a first trench having a first depth; and
a second element region including a second diffusion break region on the substrate, the second diffusion break region including a third trench having a second depth, the second depth being different from the first depth;
a first edge region including a second trench having the first depth between the first element region and the second element region; and
a second edge region including a fourth trench having the first depth, the second edge region being between the first element region and the second element region,
wherein the first edge region and the second edge region of the substrate are adjacent to each other.

11. The semiconductor device of claim 10, further comprising:
an isolation layer on the substrate in the first edge region and the second edge region.

12. The semiconductor device of claim 10, wherein the first depth is shallower than the second depth.

13. The semiconductor device of claim 12, further comprising:
a first isolation layer on the substrate in the first diffusion break region; and
a second isolation layer on the substrate in the second diffusion break region,
wherein a maximum width of the first isolation layer is smaller than a maximum width of the second isolation layer.

14. The semiconductor device of claim 10, wherein the first depth is deeper than the second depth.

15. The semiconductor device of claim 14, further comprising:
a first isolation layer on the substrate in the first diffusion break region; and
a second isolation layer on the substrate in the second diffusion break region,
wherein a maximum width of the first isolation layer is greater than a maximum width of the second isolation layer.

16. The semiconductor device of claim 10, further comprising:
a third edge region on the substrate, the third edge region including a fifth trench having the first depth or the second depth; and
a fourth edge region on the substrate, the fourth edge region including a sixth trench having the first depth or the second depth, and wherein,
the first element region is between the first edge region and the third edge region, and the second element region is between the second edge region and the fourth edge region.

17. A semiconductor device comprising:
a first element region including a single diffusion break region extending in a first direction, the single diffusion break region including a first trench having a first width in a second direction intersecting the first direction;
a first edge region extending in the first direction and including a first contact pattern;
a second element region including a double diffusion break region extending in the first direction, the double diffusion break region including a second trench having a second width wider than the first width in the second direction; and
a second edge region extending in the first direction and including a second contact pattern electrically connected with the first contact pattern,
wherein each of the first contact pattern and the second contact pattern has a third width narrower than the first width in the second direction.

18. The semiconductor device of claim 17, wherein each of the first contact pattern and the second contact pattern is a signal contact pattern transferring a signal to the first element region and the second element region.

19. The semiconductor device of claim 17, wherein each of the first contact pattern and the second contact pattern is a power contact pattern transferring a power supply voltage to the first element region and the second element region.

* * * * *